(12) United States Patent
Froehner et al.

(10) Patent No.: US 12,066,498 B2
(45) Date of Patent: Aug. 20, 2024

(54) METHOD FOR IDENTIFYING AT LEAST ONE DIAGNOSIS VARIABLE, MEASURING DEVICE AND MEASURING SYSTEM

(71) Applicant: SIEMENS AKTIENGESELLSCHAFT, Munich (DE)

(72) Inventors: Wiebke Froehner, Amberg (DE); Ivana Mladenovic, Seukendorf (DE); Thomas Werner, Rednitzhembach (DE)

(73) Assignee: Siemens Aktiengesellschaft, Munich (DE)

( * ) Notice: Subject to any disclaimer, the term of this patent is extended or adjusted under 35 U.S.C. 154(b) by 1225 days.

(21) Appl. No.: 15/950,423

(22) Filed: Apr. 11, 2018

(65) Prior Publication Data

US 2018/0292442 A1 Oct. 11, 2018

(30) Foreign Application Priority Data

Apr. 11, 2017 (EP) .................................... 17165889

(51) Int. Cl.
*G01R 31/50* (2020.01)
*G01R 25/00* (2006.01)
(Continued)

(52) U.S. Cl.
CPC ........... *G01R 31/50* (2020.01); *G01R 25/005* (2013.01); *G01R 27/26* (2013.01); *G01R 31/58* (2020.01); *G01R 27/04* (2013.01)

(58) Field of Classification Search
CPC ...... G01R 31/50; G01R 25/005; G01R 27/26; G01R 31/58; G01R 27/04; G01R 31/003; G01R 31/085; G01R 31/086
See application file for complete search history.

(56) References Cited

U.S. PATENT DOCUMENTS 4,846,130 A 7/1989 Jensen
7,285,960 B2 10/2007 Koch et al.
(Continued)

FOREIGN PATENT DOCUMENTS

CA 2836938 A1 11/2012
CN 101494374 A 7/2009
(Continued)

*Primary Examiner* — Farhana A Hoque
*Assistant Examiner* — Joseph O Nyamogo
(74) *Attorney, Agent, or Firm* — Laurence A. Greenberg; Werner H. Stemer; Ralph E. Locher (57) ABSTRACT

A method identifies a diagnosis variable which indicates an aging state of an operating device in an electrical energy supply network. In the method, first measurement values of at least one measurement variable are detected at a first measuring point of the operating device. Then simultaneously second measurement values of the at least one measurement variable are detected at a second measuring point of the operating device. The diagnosis variable is identified using respective simultaneously detected first and second measurement values. It is proposed that the first and second measurement values are detected in a time-controlled manner in such a way that a signal of the at least one measurement variable is sampled at a prescribed sampling rate at set times and over a set measurement duration so as to generate time profiles of the first and second measurement values.

6 Claims, 6 Drawing Sheets

(51) Int. Cl.
  *G01R 27/04* (2006.01)
  *G01R 27/26* (2006.01)
  *G01R 31/58* (2020.01)

(56) References Cited

U.S. PATENT DOCUMENTS

| | | | |
|---|---|---|---|
| 2007/0279041 | A1 | 12/2007 | Fritz et al. |
| 2010/0102824 | A1 | 4/2010 | Tremblay et al. |
| 2010/0301872 | A1* | 12/2010 | Kereit .................. H02H 7/28 |
| | | | 324/521 |
| 2011/0037613 | A1* | 2/2011 | Chakravorti .......... G01R 31/50 |
| | | | 340/870.07 |
| 2011/0054713 | A1* | 3/2011 | Giglio .................. H02H 3/0935 |
| | | | 361/42 |
| 2012/0278012 | A1* | 11/2012 | Ganesh ................ G01R 31/083 |
| | | | 702/58 |
| 2012/0299603 | A1* | 11/2012 | Zhao .................... G01R 31/58 |
| | | | 324/551 |
| 2018/0292442 | A1 | 10/2018 | Froehner et al. |

FOREIGN PATENT DOCUMENTS

| | | | |
|---|---|---|---|
| CN | 102879716 A | | 1/2013 |
| CN | 103323718 A | | 9/2013 |
| CN | 104678266 A | | 6/2015 |
| CN | 105699843 A | | 6/2016 |
| DE | 102012016686 A1 | | 5/2014 |
| DE | 102015014820 A1 | | 5/2016 |
| EP | 1623240 A2 | | 2/2006 |
| EP | 3388848 A1 | | 10/2018 |
| JP | 2009176107 A | | 8/2009 |
| KR | 20100104139 A | | 9/2010 |
| WO | 2012162486 A2 | | 11/2012 |
| WO | WO-2016067289 A1 * | 5/2016 | ............. G01R 17/00 |

* cited by examiner

METHOD FOR IDENTIFYING AT LEAST ONE DIAGNOSIS VARIABLE, MEASURING DEVICE AND MEASURING SYSTEM

CROSS-REFERENCE TO RELATED APPLICATION

This application claims the priority, under 35 U.S.C. § 119, of European patent application EP 17165889.1, filed Apr. 11, 2017; the prior application is herewith incorporated by reference in its entirety.

BACKGROUND OF THE INVENTION

Field of the Invention

The invention relates to a method for identifying at least one diagnosis variable, which indicates an aging state of an operating device in an electrical energy supply network, in which first measurement values of at least one measurement variable are detected at a first measuring point of the operating device, second measurement values of the at least one measurement variable are detected at a second measuring point of the operating device, and the at least one diagnosis variable is identified using respective simultaneously detected first and second measurement values.

Electrical operating devices in energy supply networks, such as transformers, cables or lines, for example, are subjected to a continual aging process by electrical loadings (for example high voltages and currents, fault states) during operation but also by external influences (such as mechanical loadings, temperature fluctuations, extreme temperatures, isolation, moisture, frost and similar influences) and as a precaution have to be checked, serviced and replaced regularly in order to ensure the correct operation of the energy supply network.

In modern electrical energy supply networks, the automatic monitoring of the aging state of an electrical operating means is very complex and expensive. For this reason, generally only very large and/or very valuable operating devices, such as transformers in high-voltage networks, for example, are equipped with appropriate sensors and evaluation systems that permit monitoring and diagnosis of the aging state in real time. In this case, the whole operating device is often not observed either, but instead only selected components are monitored.

While automatic monitoring and diagnosis of operating means therefore still takes place comparatively often in high-voltage transmission networks, in distribution networks at the medium-voltage and low-voltage level, online monitoring, that is to say monitoring during running operation, is, in contrast, rather uncommon for reasons of cost. Few selected operating devices are examined here with the aid of specific diagnosis systems, wherein they have to be taken out of operation for the examination. Different methods that are each best suited for specific operating device have been developed for diagnostic purposes. These methods are mostly based on measurements carried out offline, that is to say in the field, and operating devices to be diagnosed are first taken out of operation for this purpose.

The few diagnostic methods that can be carried out online are also specific to the operating devices. Partial discharge measurements, which are intended to identify flaws in the insulation media, are usually encountered. One example of a method for determining the aging state of operating means such as transformers or generators is known from European patent application EP 1623240 A2, corresponding to U.S. Pat. No. 7,285,960.

The measurement of partial discharges can also be used to monitor cables. A further option for diagnosis that can be carried out online is dissipation factor measurement. International patent disclosure WO 2012/162486 A2, corresponding to U.S. patent publication No. 2012/0299603, should be mentioned by way of example, which describes monitoring of the aging state of a cable that can be carried out online, wherein, however, complex measurement technology is required to make timing synchronism of the measurements at different line ends possible. In the known method, the synchronization is achieved by a synchronization device with satellite clocks that have an accuracy of at most ±40 ns. This solution also requires a high degree of communication complexity between the detectors used for measurement and a central evaluation unit.

It would be desirable, however, to know the aging state of the operating device more accurately in distribution networks as well, in order to be able to plan servicing and maintenance measures optimally. It would also be advantageous to be able to identify these states without interrupting the operation.

SUMMARY OF THE INVENTION

It is therefore the object of the invention to provide feasible and comparatively simple identification of an aging state of an operating device without interrupting the operating procedure of the operating device.

To achieve this object, a method of the type mentioned at the beginning is proposed, in which the first and second measurement values are detected in a time-controlled manner in such a way that a signal of the at least one measurement variable is sampled at a prescribed sampling rate at set times and over a set measurement duration so as to generate time profiles of the first and second measurement values.

This can advantageously achieve a situation in which no complex synchronization has to take place for the detection of the measurement values required for the calculation of the diagnosis variable. Instead, the times at which detection of the measurement values starts and how long it takes are already stipulated in advance.

The prescribed sampling rate should in this case be appropriate for the identification of the at least one diagnosis variable. By way of example, the sampling rate can be 1 million samples per second. However, other sampling rates are also possible. As a result, the measurement values can be detected at an optimum temporal resolution for the calculation of the diagnosis variable.

In accordance with one advantageous embodiment of the method according to the invention, there is also provision for the set times and/or the set measurement duration to be prescribed by a configuration.

In this case, by way of example, a configuration required during start-up of a measuring device can be specifically adjusted by inputting corresponding setting values with respect to the times and measurement durations to be used.

A further advantageous embodiment of the method according to the invention proposes that the measurement variable used is an electric current, an electrical voltage and/or a phase angle at the first and second measuring point of the operating device.

In this way, by detecting measurement variables that are common in electrical energy supply networks, a diagnosis variable that permits an indication of the aging state of the operating device can be formed.

Specifically, there can be provision in this case for the at least one diagnosis variable to be identified in the form of a dissipation factor of the operating device or of a characteristic impedance of a system equivalent circuit diagram of the operating device.

The dissipation factor effectively describes the electrical losses within the operating device that occur, for example, through the conversion of electrical energy to heat through dissipation. The dissipation factor is identified as a tangent of the loss angle δ between a complex electrical variable (e.g. current) and the imaginary component thereof. By indicating the dissipation factor, and in particular by observing a change in the dissipation factor over time, it is therefore possible to provide a suitable indication about the aging state of an operating device.

A characteristic impedance is that impedance that specifies the corresponding equivalent circuit diagram (system equivalent circuit diagram) of the operating device and, in particular, describes the operating device and the insulation system thereof.

In accordance with one possible embodiment of the method according to the invention, there is provision for the first and the second measuring point of the operating device to be arranged in physical proximity to one another and for the first and second measurement values to be detected by an individual measuring device, which is arranged in physical proximity to the measuring points.

In this case, "arranged in physical proximity to one another" is intended to mean an arrangement of the measuring points that permits the respective measurement values to be detected using a single measuring device with reasonable outlay in terms of electrical cabling. The measuring points are usually arranged in physical proximity to one another at the input and output of a local operating device, such as a transformer, a motor or a generator, for example, since it is possible, without a large degree of outlay, to detect the signals of the electrical measurement variables received at the measuring points by a single measuring device connected to the measuring sensors of the respective measuring point by way of cabling. In this case, the signals of the measurement variables led to the measuring device by way of the cabling are detected by time-controlled sampling of the signals by forming the measurement values in the measuring device.

Another embodiment of the method according to the invention makes provision for the first and the second measuring point of the operating device to be arranged at a physical distance from one another, and for the first measurement values to be detected by a first measuring device and for the second measurement values to be detected by a second measuring device.

In contrast to the preceding embodiment, in this embodiment there is no local operating device; instead, the measurement is carried out at a physically distributed operating device, such as an underground cable or an overhead power line, for example, wherein the measuring points are spaced so far apart from one another that detection of the signals of the measurement variables using a single measuring device is not only impractical, but also subject to measurement errors that arise due to the transmission of the signals over long distances. In cables in distribution networks, it is therefore absolutely possible for the measuring points to be at a distance of a few kilometers from one another. In the case of such an arrangement of the measuring points physically remotely from one another, the measurement values are consequently detected using two measuring devices.

In this connection, in accordance with one advantageous embodiment of the method according to the invention, there is provision for the first and the second measuring device to each contain a timer, which controls the time-controlled detection of the measurement values.

This can achieve a situation in which detection of measurement values that are associated with one another in terms of time takes place, from which measurement values the diagnosis variable can be identified. In this case, each of the two measuring devices carries out the detection of the measurement values in a manner controlled by the timer thereof.

Specifically, in this connection, there may be provision for the respective timer to be coordinated with an external time source by a synchronization signal.

In this way, a situation can be achieved, namely in which the timers in the measuring devices are coordinated with one another in terms of time as well as possible, such that detection of measurement values that are associated with one another in terms of time is simplified.

Furthermore, in this connection, a further advantageous embodiment makes provision for the stipulated times and measurement durations for detecting the measurement values of the first and the second measurement values to be stipulated in terms of time in such a way that the measurement values are detected simultaneously in a time-controlled manner at least over an overlap time range in the two measuring devices.

In this case, the time-controlled detection of the measurement values advantageously takes place in such a way that, during said detection, at least some measurement values detected by the respective measuring device are always detected at both measuring points simultaneously with one another. The time durations for which the measurement values are detected at the two measuring points can therefore begin at different absolute times and have different lengths; it suffices for the evaluation when the time durations have only one overlap region within which measurement values are detected simultaneously—absolutely in terms of time—at both measuring points.

In this connection, there may specifically be provision, for example, for the profiles of the first and second measurement values to be stored and, by subsequent synchronization, for respective simultaneously detected measurement value pairs of the at least one measurement variable to be identified from the profiles.

This embodiment has the advantage that, even in the case of timers of the measuring devices that are not highly accurately synchronized with one another, those measurement values that have actually been detected at simultaneous—seen in absolute terms—measurement times can be identified from the stored profiles. As a result of the fact that the synchronization is carried out subsequently based on the stored profiles and does not have to be provided in advance by complex measures with respect to the timers of the measuring devices, it is possible to use timers that are comparatively cheap—however, also more inaccurate as a result. One example of a cost-effective timer that can be used in a measuring device according to the invention is a timer used in the field of radio-controlled clocks, the time of which timer is set using a DCF77 signal, which is emitted every long wave. The accuracy of such a timer is approximately 100 ms, which would be too inaccurate for highly accurate measurements in the field of energy supply networks per se.

However, due to the subsequent synchronization, differences in the times of the two timers can be compensated for comparatively easily.

In this connection, there may be provision for, by way of example, in each case the first time derivative to be formed from the profiles of the first and second measurement values for the subsequent synchronization, for the maximum and the associated time at which the maximum occurs in the respective profile to be identified in each profile of the derived measurement values, and for those measurement values that have been detected at the time of the respective maximum to be used as the simultaneously detected measurement value pair.

In this way, a subsequent temporal synchronization can be carried out using simple mathematical measures, namely merely by forming the first derivative of the profile. This utilizes the effect of a pattern being impressed on the amplitudes of the signals by external influences, for example by noise on the signals of the measurement variables to be measured, said pattern being able to be identified simultaneously at both measuring points. If these effects are marked by forming the gradient, it is thus possible to use the effects to synchronize the measurement values by virtue of those measurement values of the profiles that have been detected at the respective time of the greatest gradient being assumed to be simultaneously detected.

A further advantageous embodiment of the method according to the invention makes provision here for at least that measurement value pair that has been detected at the time of the respective maximum to be transmitted to an evaluation device, and for the diagnosis variable to be identified using the evaluation device.

The evaluation device can in this case be a separate device or component part of one of the measuring devices. The diagnosis variable can in this case be identified on the basis of a measurement value pair or a plurality of measurement value pairs. As a result of the fact that at least the measurement value pair identified by the subsequent synchronization has been recognized as simultaneously detected, the surrounding measurement values can also be accordingly associated with one another in terms of time.

The abovementioned object is also achieved by a measuring device for detecting measurement values in an electrical energy supply network, the measuring device having a sampling device for sampling a signal of at least one electrical measurement variable using a prescribed sampling rate.

The invention provides a timer, which is configured to detect the measurement values in a time-controlled manner in such a way that the signal of the measurement variable is sampled at a prescribed sampling rate at set times and over a set measurement duration so as to generate a time profile of the measurement values, and provides a storage device for storing the profiles of the measurement values.

All of the statements made above and below regarding the method according to the invention accordingly hold true with respect to the measuring device according to the invention and vice-versa; in particular, the measuring device according to the invention is configured to carry out the method according to the invention in any desired embodiment or a combination of desired embodiments. With respect to the advantages of the measuring device according to the invention, reference is also made to the advantages described regarding the method according to the invention.

Furthermore, the abovementioned object is achieved by a measuring system for identifying at least one diagnosis variable having at least two measuring devices. The measuring system has a synchronization device, which is formed to identify, by subsequent synchronization, respective measurement value pairs detected simultaneously in the measuring devices from the profiles of the measurement values by virtue of the fact that the synchronization device forms in each case the first time derivative in each profile of the measurement values, identifies the maximum in each profile of the derived measurement values and uses those measurement values that have been detected at the time of the respective maximum as the simultaneously detected measurement value pair, and the measuring system having an analysis device, which is configured to identify the at least one diagnosis variable at least from the simultaneously detected measurement value pair.

All of the statements made above and below regarding the method according to the invention accordingly hold true with respect to the measuring system according to the invention and vice-versa; in particular, the measuring system according to the invention is configured to carry out the method according to the invention in any desired embodiment or a combination of desired embodiments. With respect to the advantages of the measuring system according to the invention, reference is also made to the advantages described regarding the method according to the invention.

The invention will be explained in more detail herein below on the basis of an exemplary embodiment. The specific design of the exemplary embodiment is not to be understood as restricting for the general design of the method according to the invention and the device according to the invention in any way; instead, individual design features of the exemplary embodiment can be combined in any desired manner freely with one another and with the features described above.

Other features which are considered as characteristic for the invention are set forth in the appended claims.

Although the invention is illustrated and described herein as embodied in a method for identifying at least one diagnosis variable, a measuring device and a measuring system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
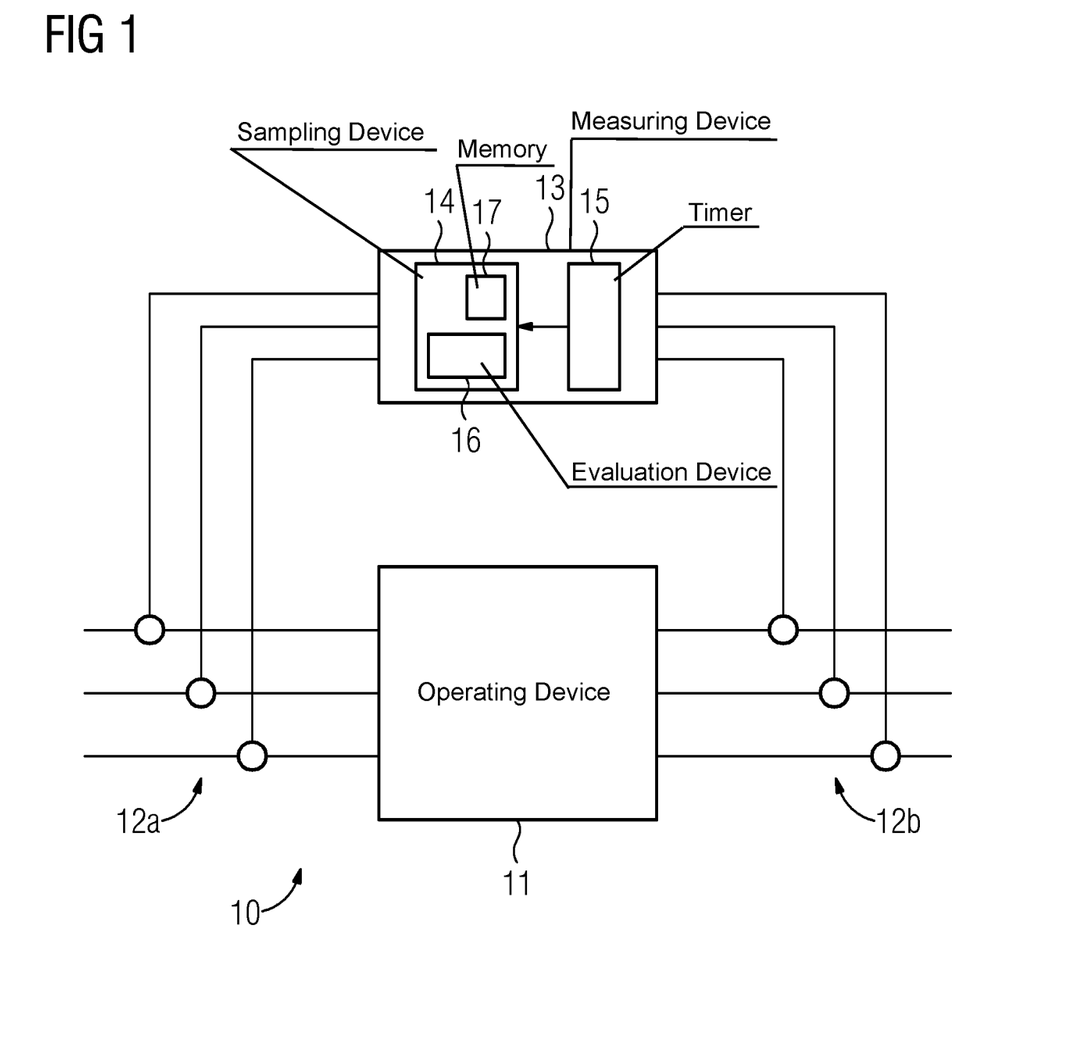
FIG. 1 is a block diagram of a first exemplary embodiment of a measuring system for identifying at least one diagnosis variable, in which measuring points are arranged in physical proximity to one another.

Referring now to the figures of the drawings in detail and first, particularly to FIG. 1 thereof, there is shown a schematic illustration of a measuring system 10, using which a diagnosis variable for indicating an aging state of an electrical operating device 11, for example a transformer, in an electrical energy supply network (not illustrated further) is intended to be identified. For this purpose, provision is made of two measuring points 12a and 12b, at which signals of electrical measurement variables, for example currents and/or voltages, are detected using purely schematically indicated measurement pickups, for example current and/or voltage transducers. The signals are subsequently supplied to a measuring device 13, which can be used to determine the at least one diagnosis variable from the signals.

The measuring device 13 has a sampling device 14, which has a sampling clock applied to it, for example at a sampling rate of 1 million samples per second, and which samples the signals so as to obtain measurement values. Specifically, the signal of the at least one measurement variable originating from the first measuring point 12a is sampled so as to obtain first measurement values, whereas the signal of the at least one measurement variable originating from the second measuring point 12b is sampled so as to obtain second measurement values.

The sampling is effected in a time-controlled manner by a timer 15, which transmits a start signal to the sampling device 14 at a predetermined time and causes said sampling device to sample the signals of the two measuring points 12a, 12b. The sampling is carried out over a predetermined measurement duration. The measurement duration can be set either in the sampling device or in the timer 15. In the latter case, the timer 15 also transmits a stop signal to the sampling device 14 in order to terminate the detection of the first and second measurement values. The detection is subsequently carried out again at a following predetermined time. For example, this makes it possible to set a situation in which detection of the first and second measurement values is intended to take place every 24 hours for a measurement duration of 2 seconds. Other settings are likewise possible.

The stipulation of the sampling times and the measurement duration can be specified as a setting value, for example, during a configuration of the measuring device 13.

In the embodiment in accordance with FIG. 1, the measuring points 12a and 12b are arranged in physical proximity to one another at a local operating device. For example, the measuring point 12a can be arranged at the input of the operating device 11 and the measuring point 12b can be arranged at the output of the operating device.

The diagnosis variable can be, for example, a dissipation factor or a characteristic impedance of the system equivalent circuit diagram of the operating device. The aging of the operating device can be stipulated particularly well based on a dissipation factor. Alternatively, other diagnosis variables, for example complex impedances, can also be identified or further variables can be derived therefrom.

In particular, a change in the diagnosis variable and hence progressing aging of the operating means can be identified by comparing temporally successively identified diagnosis variables, for example observed over the course of a year. A threshold value can be stipulated for the diagnosis variable, where, upon reaching said threshold value, a critical aging state of the operating device is stipulated. It is also possible to stipulate a plurality of threshold values in order to be able to identify different grades of the aging state.

In the exemplary embodiment in accordance with FIG. 1, the identification of the diagnosis variable takes place in the measuring device 13 itself. To this end, the measuring device 13 has an evaluation device 16, which determines the diagnosis variable using the first and second measurement values. The measurement variables based on the measurement values can be, for example, currents, voltages and/or phase angles.

Figure 2:
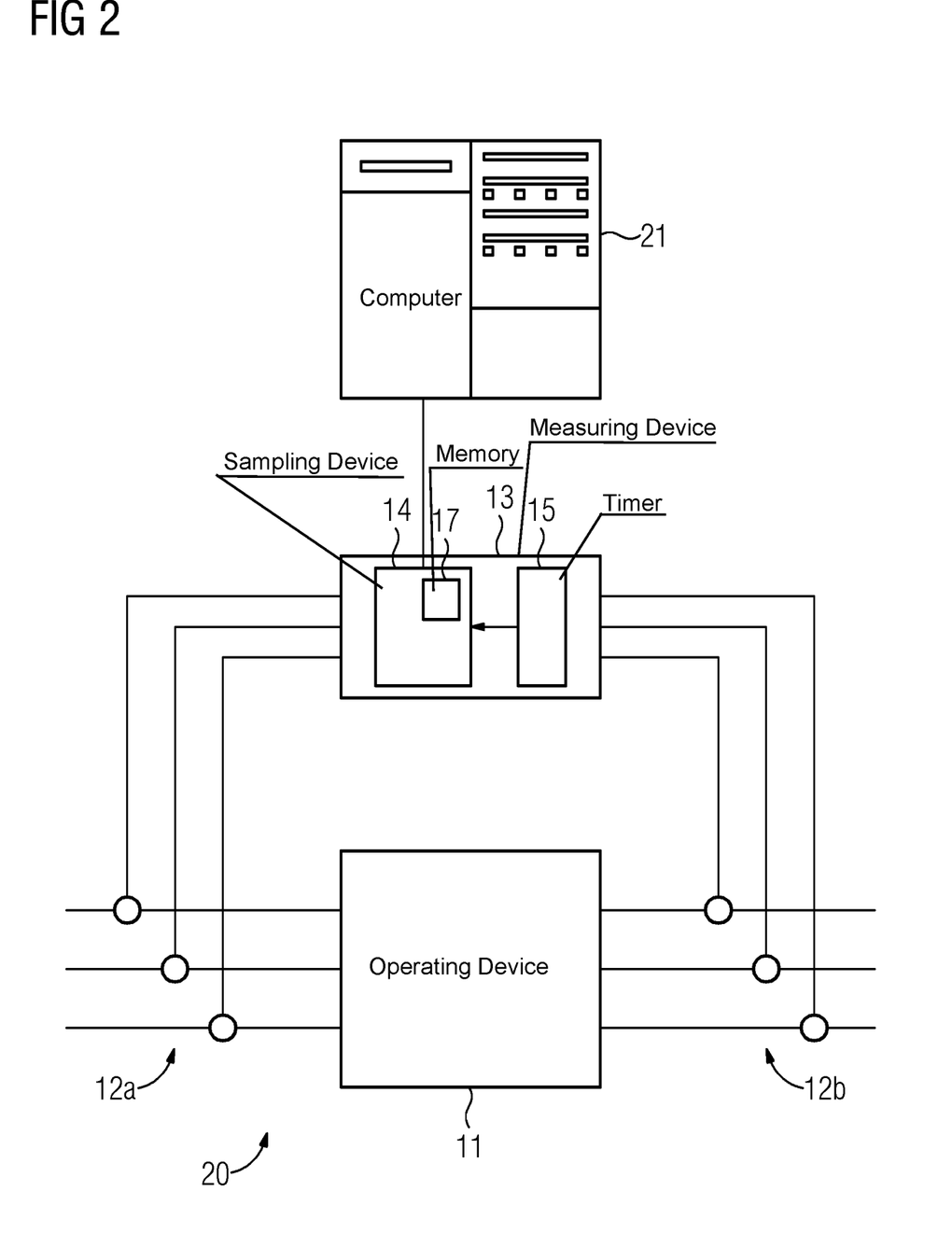
FIG. 2 is a block diagram of a second exemplary embodiment of the measuring system for identifying the at least one diagnosis variable, in which the measuring points are arranged in physical proximity to one another.

FIG. 2 shows another embodiment of a measuring system 20 for identifying a diagnosis variable at a local operating device 11. In FIGS. 1 and 2, corresponding or comparable components are denoted by the same reference signs.

The essential difference of the measuring system 20 from the measuring system 10 of FIG. 1 is that the evaluation device is not provided in the measuring device 13 itself but is formed as a central computer system 21. The central computer system may be in the form of a control point, a station control computer or else a cloud computer system and may execute the determination of the diagnosis variable. To this end, the first and second measurement values are supplied to the central computer system 21 by the measuring device 13.

The further mode of operation of the measuring system 20 corresponds to that of the measuring system 10.

It is therefore possible to use the measuring systems 10 and 20 of FIGS. 1 and 2 to carry out a diagnosis method in which local measuring devices 13 alone or in cooperation with a central computer system 21 can obtain statements about the aging state of an electrical operating means 11 online, that is to say during operation of the operating means 11.

The measuring device 13 and, where appropriate, the central computer system 21 are configured here in such a way that they can also be used in secondary distribution networks in which state monitoring of electrical operating device 11 is not possible today for reasons of cost.

In accordance with one execution, the proposed method is based on measurement of the dissipation factor of the electrical operating device 11. In order to circumvent the highly accurate time synchronization usually required for this today and the expensive transmission of large amounts of data, the following procedure is proposed:

The measuring device 13 detects signals of measurement variables, for example polyphase currents and voltages at the electrical input and/or output of the electrical operating device 11 at a very high sampling rate, for example 1 million samples per second. In the case of physically concentrated operating means (for example transformers, generators, motors, switches), the measuring device 13 is embodied in such a way that it receives the measurements both on the input side and on the output side.

The measuring device 13 contains the timer 15, which may be, for example, an inexpensive radio clock module, the time synchronization of which can be effected, for example, on the basis of the DCF77 signal, which is emitted every longwave. A cost-effective timer of this kind is usually not accurate enough for application in energy automation systems. However, the use proposed here can make it possible to use such a timer.

At predetermined times defined in the configuration of the measuring device 13, the measuring device 13 samples, for example, the signals of the connected current and voltage sensors so as to obtain current and voltage values and initially stores them in an internal memory 17.

In the event of locally concentrated operating device 11, the measurements can be evaluated in principle in the measuring device 13 itself (FIG. 1). The specific parameters of the operating device, for example with respect to the insulation medium, are also determined, for example in the form of a dissipation factor or a characteristic impedance of the system equivalent circuit diagram of the operating device, from the temporally associated measurement values. To this end, it is possible, for example, proceeding from temporally associated current and voltage measurement values that have been recorded at the input and output of the operating device 11 at several predefined times, to calculate the dissipation factors or characteristic impedances of the observed operating device 11 and hence to identify the parameters of an associated system equivalent circuit diagram.

Over the course of the years of operation, the calculated dissipation factors or characteristic impedances or the components thereof (real and imaginary component) change and indicate an aging process as a result.

In the case of a transformer as the operating device, the operating device consists here, for example, of the actual transformer and associated feed-throughs. The losses that arise in each feed-through and in the transformer insulation itself are calculated by further processing of the dissipation factors or characteristic impedances.

It is furthermore possible to observe different physical processes in the insulation that make additional information and refinements of the diagnostic statements possible. For example, measurements at different loads (and hence different temperatures of the insulation medium) can thus supply an impedance or dissipation factor temperature spectrum, for example, the evaluation of the spectrum generating the state of the oil or the insulation paper.

Figure 3:
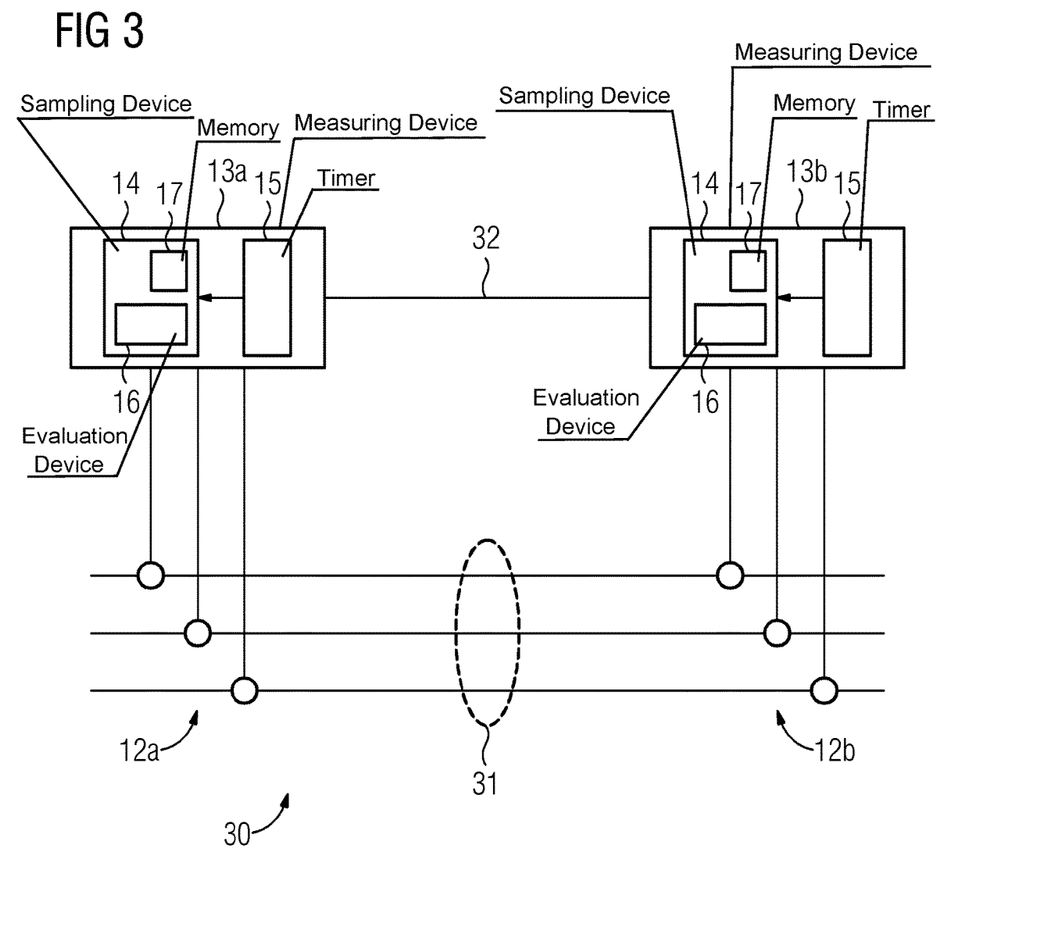
FIG. 3 is a block diagram of the first exemplary embodiment of the measuring system for identifying the at least one diagnosis variable, in which the measuring points are arranged at a physical distance from one another.
Figure 4:
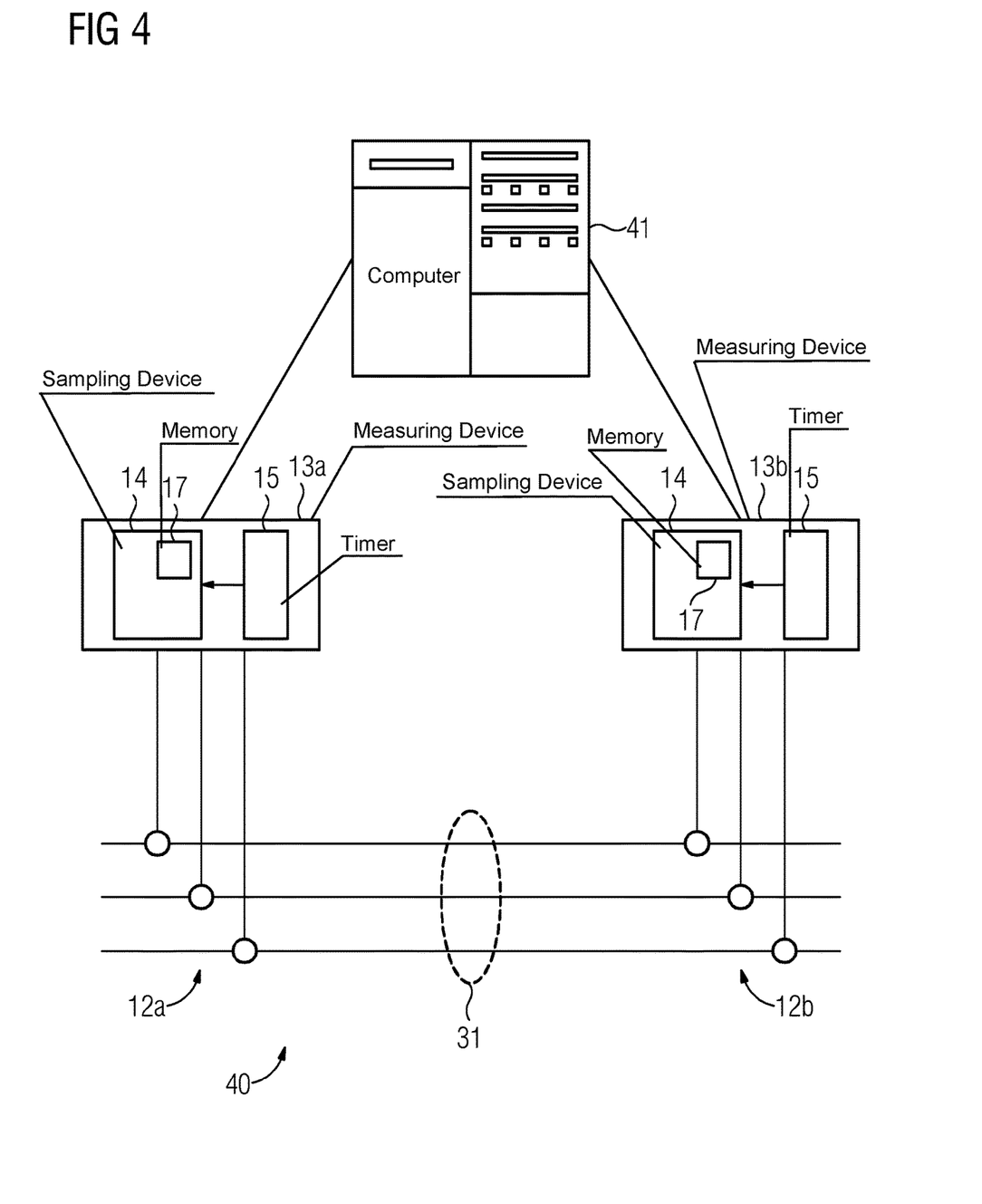
FIG. 4 is a block diagram of the second exemplary embodiment of the measuring system for identifying the at least one diagnosis variable, in which the measuring points are arranged at a physical distance from one another.

Other embodiments of the measuring system in which the measuring points are arranged at a physical distance from one another are shown in FIGS. 3 and 4. In principle, the mode of operation corresponds to that already described in respect of FIGS. 1 and 2. Corresponding or comparable elements are therefore provided with the same reference signs.

FIG. 3 shows a measuring system 30, which serves to identify a diagnosis variable at a physically distributed operating device 31. A physically distributed operating device of this kind may be, for example, a cable or an overhead power line. The measuring points 12a and 12b arranged at the input and output of the operating device 31 are therefore at a comparatively great distance from one another such that the detection of the signals of the measurement variables using a single measuring device would be impractical and would also involve measurement errors.

The detection of the signals of the measurement variables therefore takes place accordingly using two measuring devices 13a and 13b, which are each arranged in physical proximity to the respective measuring point 12a, 12b. Specifically, first measurement values are detected at the first measuring point 12a using the first measuring device 13a and second measurement values are detected at the second measuring point 12b using the second measuring device 13b.

Each of the measuring devices 13a, 13b is formed according to the measuring device 13 explained with reference to FIG. 1. In order to use suitable first and second measurement values for the identification of the diagnosis variable despite more cost-effective and comparatively more inaccurate timers 15, subsequent temporal synchronization takes place by means of a synchronization device, which may be, for example, a component part of the evaluation device, using which such measurement value pairs whose measurement values have been detected simultaneously are respectively identified.

In the exemplary embodiment in accordance with FIG. 3, the identification of the diagnosis variable takes place in one of the measuring devices 13a, 13b or in both measuring devices 13a, 13b. To this end, the measurement values are transmitted by use of a communication link 32, which can be of wireless or wired design, between the measuring devices 13a, 13b and the subsequent synchronization is carried out. The diagnosis variable is then identified using the detected measurement value pairs.

FIG. 4 shows another embodiment of a measuring system for identifying a diagnosis variable at an operating means 31 arranged in distributed fashion. In FIGS. 3 and 4, corresponding or comparable components are again denoted by the same reference signs.

The essential difference of the measuring system 40 of FIG. 4 from the measuring system 30 of FIG. 3 is that the evaluation device is not provided in one or both measuring devices 13a, 13b themselves but instead is formed as a central computer system 41 as in the exemplary embodiment according to FIG. 2. The central computer system may be in the form of a control point, a station control computer or else a cloud computer system and may execute the determination of the diagnosis variable. To this end, the first and second measurement values are supplied to the central computer system 41 by the measuring device 13a, 13b.

The further mode of operation of the measuring system 40 corresponds to that of the measuring system 30.

It is therefore possible to use the measuring systems 30 and 40 of FIGS. 3 and 4 to carry out a diagnosis method in which measuring devices 13a, 13b arranged in physically distributed fashion alone or in cooperation with a central computer system 41 can obtain statements about the aging state of an electrical operating device 31 online, that is to say during operation of the operating device 31.

In general, it is therefore necessary in the case of a physically distributed operating device 31 to combine the measurement values from the input and output of the operating device. To this end, the measuring devices 13a, 13b transmit their measurement values either to one another or to the central computer system 41. For the determination of the diagnosis variable, for example the dissipation factor, it would suffice to combine in each case just one measurement value pair of current and voltage. However, the measurement values have to have been recorded at the same time, that is to say must be synchronous in terms of time within the scope of very high timing accuracy. However, the comparatively simple timers, for example radio clock modules, that are used in the measuring devices as described generally only have a timing accuracy of ±0.1 s.

Figure 5:
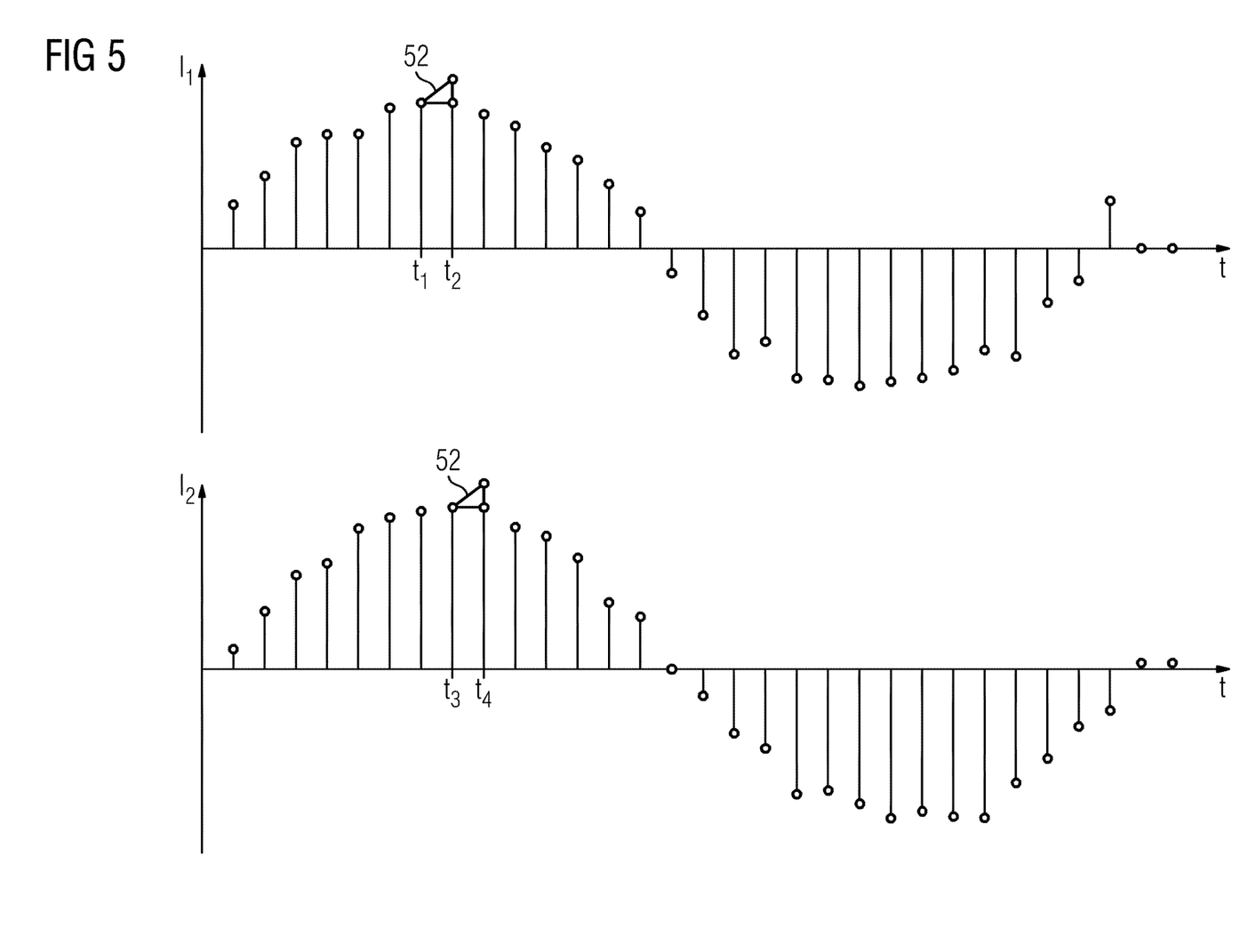
FIG. 5 are graphs showing profiles of current measurement values, which have been recorded at the two measuring points, for explaining a subsequent temporal synchronization.

For this reason, the following procedure is proposed: During a configuration procedure, for example in the start-up of the measuring system 30, 40, a temporal measurement window is parameterized in the measuring devices 13a, 13b, the two measuring devices 13*a*, 13*b* sampling the measurement values, for example current and voltage values, within said window. This is effected by prescribing a time and a measurement duration, for example daily from 12:00:00 to 12:00:02 (hh:mm:ss). The timers in both measuring devices 13*a*, 13*b* generally have a time offset, which is caused by the inaccuracy of the time measurement thereof. The profiles of the first and second measurement values are therefore not detected synchronously with one another in terms of time. These profiles are illustrated in FIG. 5 by way of example for first and second current measurement values I1 and I2. It is important for the measurement duration to be selected here in such a way that the measurement windows of both measuring devices 13*a*, 13*b* overlap at least in a partial range.

The capacitive and inductive properties of the operating device lead to a phase shift in the variables, such that the extreme values of the voltages and currents (and hence all other values of the sinusoidal curve) are present at different times. However, the amplitude gradients are not influenced thereby. Therefore, with the aid of the changes in amplitude caused by the noise of the variables to be measured, temporally associated measurement values can be inferred and hence a subsequent time synchronization can be undertaken.

In order to be able to assign the respective temporally matching first and second measurement values, that is to say first and second measurement values detected simultaneously in terms of absolute value at the input and output of the operating device 31, to one another and hence to form a measurement value pair, in each case the first derivative is therefore formed from the respective profile of the first and second measurement values, that is to say the gradient of the measurement value from one sampling interval to the next. The measurement value pairs present at the time of the greatest gradients (indicated in FIG. 5 by a respective triangle 51, 52 with which the slope of the profiles is symbolized) are transmitted to the evaluation device. In FIG. 5, these measurement value pairs are present at the times t1 and t3 as well as t2 and t4.

Further measurement value pairs, which are situated within a time range within the inaccuracy range of the respective timer 15 and which have a gradient of approximately equal size, are then assumed for the remainder to be synchronous with one another in terms of time and hence suitable for the identification of the diagnosis variable (for example dissipation factor calculation).

Figure 6:
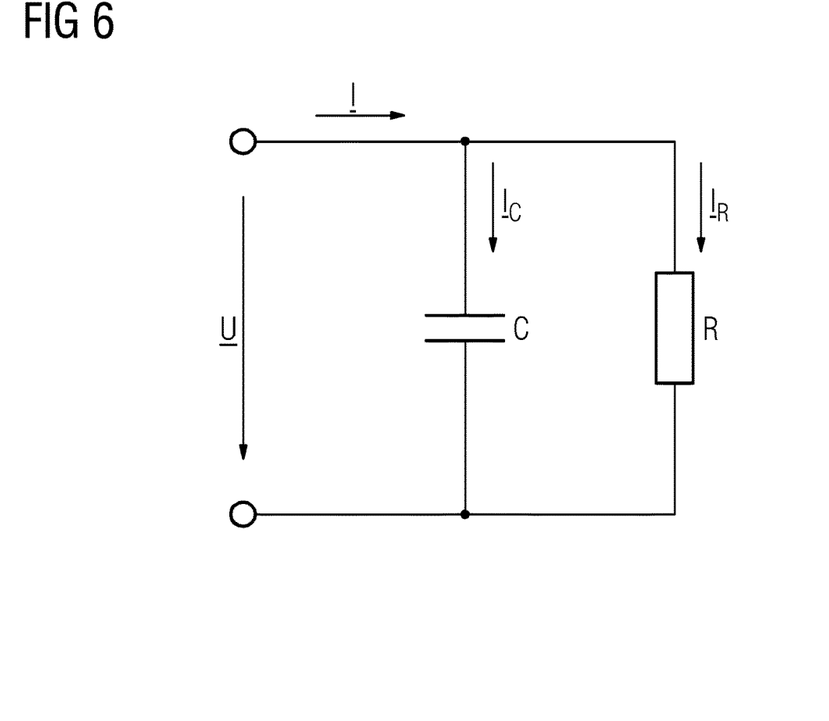
FIG. 6 is an equivalent circuit diagram of an electrical cable for the purpose of explaining the dissipation factor.

FIG. 6 shows a schematic illustration of an equivalent circuit diagram of an operating means having a flowing current I, an applied voltage U and capacitive (Ic, C) and ohmic (IR, R) components. It is possible to infer the aging state of the operating device by measuring the measurement variables current and voltage at the input and output of the operating means.

Figure 7:
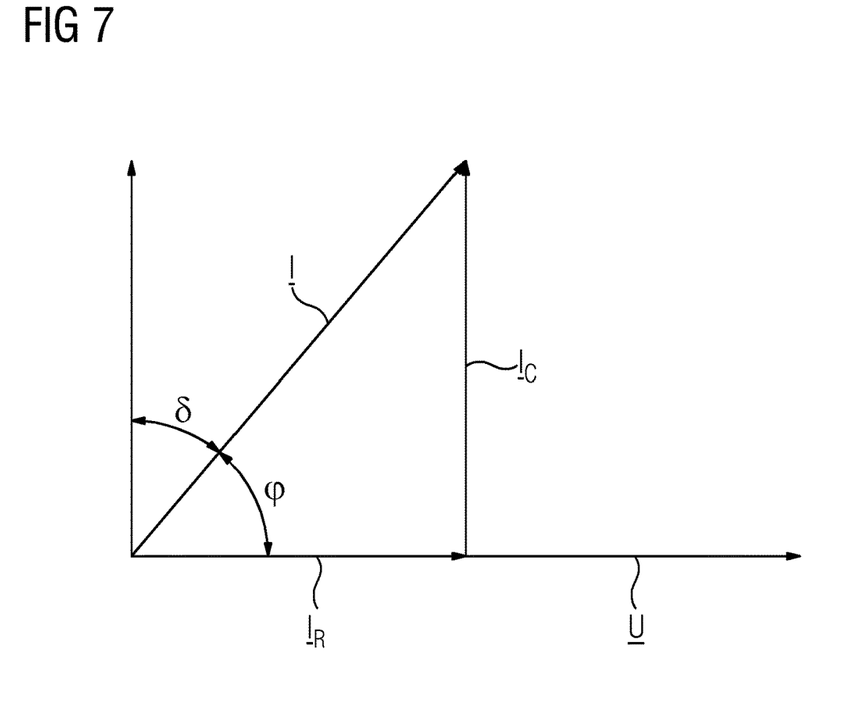
FIG. 7 is a graph for explaining the identification of a dissipation factor.

For the example of the dissipation factor, FIG. 7 shows by way of example a graph from which the dissipation factor can be determined as the tangent of the loss angle $\delta$. It is possible to identify the current vector shown in FIG. 7 relative to the voltage vector and hence the loss angle $\delta$ by measuring currents and voltages at both measuring points.

The aging states of the operating device are then determined with the aid of, for example, the dissipation factors measured over a period (for example a year). To this end, either the evaluation device provided in a measuring device or the central computer system keeps a collection of aging models (for example operating-means-specific threshold values of the diagnosis variable), which are used to draw conclusions from the identified diagnosis variables or the time profile of the diagnosis variables about the remaining lifetime of the operating means taking into account the loading to be expected.

The aging state of an electrical operating means can therefore be monitored continuously using the described method. In this case, complex measures for time synchronization are not required in the measuring devices. Only small amounts of data are exchanged between the measuring devices or between a measuring device and a central computer system. With certain operating means (for example transformers), the state of feed-throughs, oil and paper insulation can optionally be determined at the same time.

Although the invention has been illustrated and described in more detail above by preferred exemplary embodiments, the invention is not restricted by the disclosed examples and other variations can be derived herefrom by a person skilled in the art without departing from the scope of protection of the subsequent patent claims.

The invention claimed is:

1. A method for identifying at least one diagnosis variable indicating an aging state of an operating device in an electrical energy supply network, which comprises the steps of:
    detecting first measurement values of at least one measurement variable at a first measuring point of the operating device by means of a first measuring device;
    detecting second measurement values of the at least one measurement variable at a second measuring point of the operating device by means of a second measuring device, wherein the first and the second measuring point of the operating device are disposed at a physical distance from one another, the first and second measurement values being detected in a time-controlled manner such that a signal of the at least one measurement variable is sampled at a prescribed sampling rate at set times and over a set measurement duration so as to generate time profiles of the first and second measurement values, wherein stipulated times and measurement durations for detecting the measurement values of the first and the second measurement points are stipulated in terms of time such that the measurement values are detected simultaneously in the time-controlled manner at least over an overlap time range in the first and second measuring devices; and
    storing the time profiles of the first and second measurement values and, by subsequent synchronization, respective simultaneously detected measurement value pairs of the at least one measurement variable are identified from the time profiles;
    forming in each case a first time derivative from the time profiles of the first and second measurement values for the subsequent synchronization, a maximum and an associated time at which the maximum occurs in a respective profile are identified in each profile of derived measurement values, and the measurement values that have been detected at a time of the maximum are used as the simultaneously detected measurement value pair; and
    identifying the at least one diagnosis variable using respective simultaneously detected said first and second measurement values.

2. The method according to claim 1, wherein the set times and/or the set measurement duration is prescribed by a configuration.

3. The method according to claim 1, which further comprises selecting the measurement variable from the group consisting of an electric current, an electrical voltage and a phase angle at the first and second measuring points of the operating device.

4. The method according to claim 1, which further comprises identifying the at least one diagnosis variable in a form of a dissipation factor of the operating device or of a characteristic impedance of a system equivalent circuit diagram of the operating device.

5. The method according to claim 1, which further comprises:
   transmitting at least the measurement value pair that has been detected at the time of the maximum to an evaluation device; and
   identifying the at least one diagnosis variable using the evaluation device.

6. A measuring system for identifying at least one diagnosis variable, the measuring system comprising:
   at least two measuring devices, each containing:
      a sampling device for sampling a signal of at least one electrical measurement variable using a prescribed sampling rate;
      a timer configured to detect measurement values in a time-controlled manner such that a signal of a measurement variable is sampled at a prescribed sampling rate at set times and over a set measurement duration so as to generate a time profile of the measurement values; and
      a storage device for storing profiles of the measurement values;
   a synchronization device formed to identify, by subsequent synchronization, respective measurement value pairs detected simultaneously in said measuring devices from the profiles of the measurement values by virtue of the fact that said synchronization device forms in each case a first time derivative in each profile of the measurement values, identifies a maximum in each said profile of derived measurement values and uses the measurement values that have been detected at a time of a respective maximum as the simultaneously detected measurement value pair; and
   an evaluation device configured to identify the at least one diagnosis variable at least from the simultaneously detected measurement value pair.

* * * * *

UNITED STATES PATENT AND TRADEMARK OFFICE
CERTIFICATE OF CORRECTION

PATENT NO. : 12,066,498 B2
APPLICATION NO. : 15/950423
DATED : August 20, 2024
INVENTOR(S) : Wiebke Froehner et al.

Page 1 of 1

It is certified that error appears in the above-identified patent and that said Letters Patent is hereby corrected as shown below:

In the Claims

Column 12, Claim 1, Line 45 should read as follows:
first and second measuring devices;

Signed and Sealed this
Eighth Day of October, 2024

Katherine Kelly Vidal
*Director of the United States Patent and Trademark Office*